(12) United States Patent
Kim

(10) Patent No.: US 8,232,562 B2
(45) Date of Patent: *Jul. 31, 2012

(54) LIGHT EMITTING DEVICE EMPLOYING NANOWIRE PHOSPHORS

(75) Inventor: Hwa-Mok Kim, Seoul (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/848,632

(22) Filed: Aug. 2, 2010

(65) Prior Publication Data

US 2010/0295441 A1   Nov. 25, 2010

Related U.S. Application Data

(63) Continuation of application No. 11/955,469, filed as application No. PCT/KR2006/002147 on Jun. 5, 2006, now Pat. No. 7,821,022.

(30) Foreign Application Priority Data

Jul. 11, 2005 (KR) .......................... 10-2005-0062298

(51) Int. Cl.
  *H01L 27/15* (2006.01)
(52) U.S. Cl. ................ 257/79; 257/81; 257/97; 257/98; 438/22; 438/29; 438/34; 438/35
(58) Field of Classification Search .................. 362/555; 977/762; 257/81, 90, 97–99, E33.012, E33.072; 438/22, 29, 34–35, 428

See application file for complete search history.

(56) References Cited

U.S. PATENT DOCUMENTS

| 6,650,044 | B1 | 11/2003 | Lowery |
| 6,812,500 | B2 | 11/2004 | Reeh et al. |
| 2002/0190260 | A1* | 12/2002 | Shen et al. ...................... 257/81 |
| 2003/0030067 | A1 | 2/2003 | Chen |
| 2003/0227249 | A1 | 12/2003 | Mueller et al. |
| 2004/0012027 | A1 | 1/2004 | Keller et al. |
| 2005/0006659 | A1 | 1/2005 | Ng et al. |

(Continued)

FOREIGN PATENT DOCUMENTS

JP    2004-071908    3/2004

(Continued)

OTHER PUBLICATIONS

Final Office Action dated Apr. 27, 2010 in U.S. Appl. No. 11/995,469.

(Continued)

*Primary Examiner* — Kimberly Rizkallah
*Assistant Examiner* — Mark A Laurenzi
(74) *Attorney, Agent, or Firm* — H.C. Park & Associates, PLC

(57) ABSTRACT

Disclosed is a light emitting device employing nanowire phosphors. The light emitting device comprises a light emitting diode for emitting light having a first wavelength with a main peak in an ultraviolet, blue or green wavelength range; and nanowire phosphors for converting at least a portion of light having the first wavelength emitted from the light emitting diode into light with a second wavelength longer than the first wavelength. Accordingly, since the nanowire phosphors are employed, it is possible to reduce manufacturing costs of the light emitting device and to reduce light loss due to non-radiative recombination.

9 Claims, 2 Drawing Sheets

U.S. PATENT DOCUMENTS

2005/0208302 A1* 9/2005 Yi et al. .................. 428/402
2006/0068154 A1* 3/2006 Parce et al. ................ 428/76
2008/0020235 A1    1/2008 Parce et al.

FOREIGN PATENT DOCUMENTS

| JP | 2005-0079540 | 3/2005 |
| KR | 20020079513 | 10/2002 |
| TW | I222229 | 10/2004 |
| WO | 2005062391 | 7/2005 |
| WO | 2005067524 | 7/2005 |

OTHER PUBLICATIONS

Non-Final Office Action dated Nov. 13, 2009 in U.S. Appl. No. 11/995,469.

Hwa-Mok Kim et al. InGaN nanorods grown on (111) silicon substrate by hydride vapor phase epitaxy, Chemical Physics Letters, Sep. 26, 2003, pp. 181-184, vol. 380.

Non-Final Office Action dated Apr. 30, 2009 in U.S. Appl. No. 11/995,469.

Taiwanese Office Action dated Sep. 19, 2008.

Notice of Allowance of U.S. Appl. No. 11/995,469 issued on Aug. 11, 2010.

* cited by examiner

[Fig. 1]
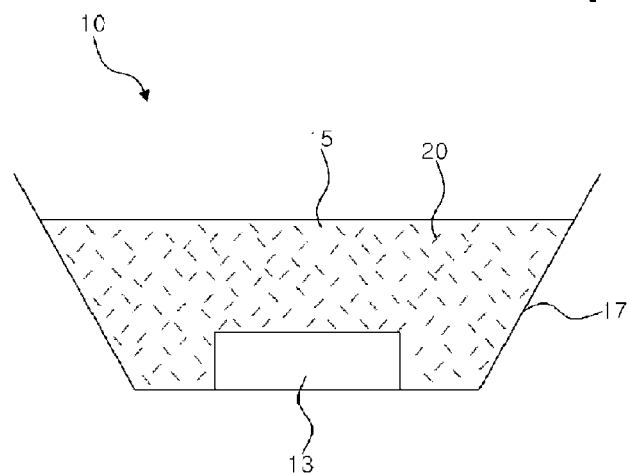
[Fig. 2]
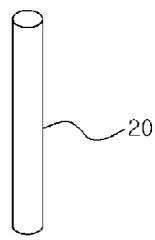
[Fig. 3]
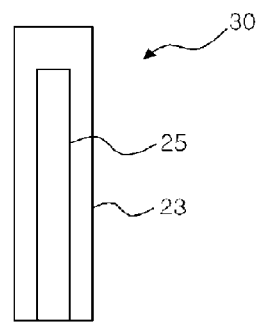
[Fig. 4]
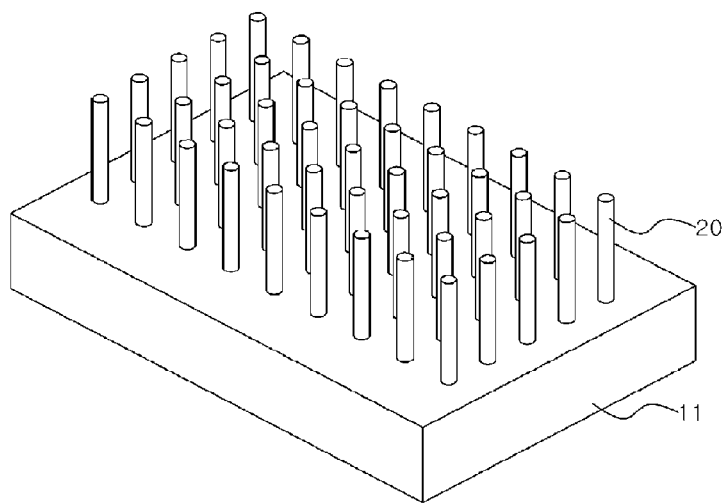

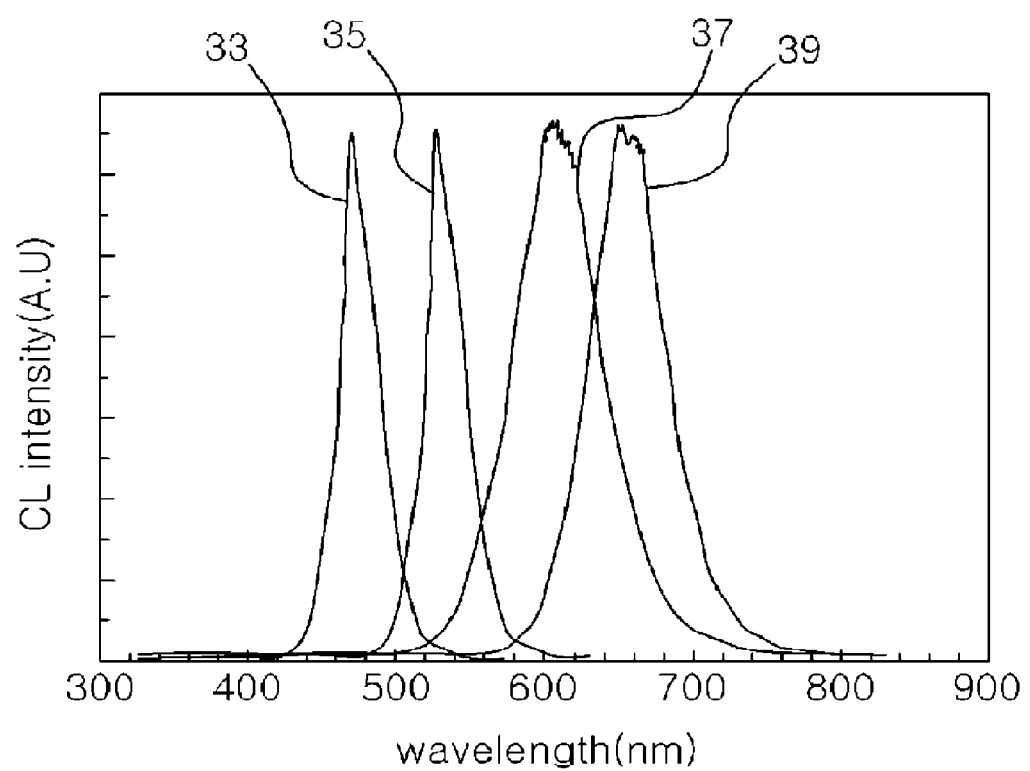
[Fig. 5]

LIGHT EMITTING DEVICE EMPLOYING NANOWIRE PHOSPHORS

CROSS REFERENCE TO RELATED APPLICATIONS

This application is a continuation of U.S. application Ser. No. 11/995,469, filed on Jan. 25, 2008, which is the National Stage of International Application No. PCT/KR2006/002147, filed on Jun. 5, 2006, and claims priority from and the benefit of Korean Patent Application No. 2005-062298, filed on Jul. 11, 2005, which are all hereby incorporated by reference for all purposes as if fully set forth herein.

BACKGROUND OF THE INVENTION

1. Field of the Invention

The present invention relates to a light emitting device, and more particularly, to a light emitting device capable of reducing light loss due to wavelength conversion by employing nanowire phosphors.

2. Discussion of the Background

U.S. Pat. No. 6,812,500 discloses a light emitting device comprising a GaN-based, particularly, AlInGaN-based light emitting diode capable of emitting ultraviolet or blue light, and phosphors absorbing a portion of light emitted from the light emitting diode and emitting light with converted wavelengths, thereby implementing polychromatic light, e.g., white light. Since such a white light emitting device uses a single-wavelength light source as a light source, its structure is very simple as compared with a white light emitting device using a plurality of light sources for different wavelengths.

Examples of phosphors used in the white light emitting device include an YAG:Ce phosphor using $Ce^{3+}$ as an activator, an orthosilicate phosphor represented by $Sr_2SiO_4$:Eu using $Eu^{2+}$ as an activator, and a thiogallate phosphor such as $CaGa_2S_4$:Eu.

These phosphors are generally prepared in a powder form through a solid state reaction method, and high-purity raw materials and strict stoichiometric compositions are required to synthesize these phosphors. Particularly, heat treatment at a high temperature of 1300° C. or more is required to synthesize YAG:Ce. This raises costs of the phosphors, leading to increase in manufacturing costs of the white light emitting device.

Further, since each of these powdered phosphors has many traps therein, it is likely to cause non-radiative recombination. Such non-radiative recombination leads to light loss, resulting in considerable reduction of wavelength conversion efficiency.

SUMMARY OF THE INVENTION

An object of the present invention is to provide a light emitting device employing phosphors that can be easily prepared to have high purity.

Another object of the present invention is to provide a light emitting device employing phosphors capable of reducing light loss due to non-radiative recombination.

To achieve these objects of the present invention, a light emitting device according to an embodiment of the present invention comprises a light emitting diode for emitting light having a first wavelength with a main peak in an ultraviolet, blue or green wavelength range; and nanowire phosphors for converting at least a portion of light having the first wavelength emitted from the light emitting diode into light with a second wavelength longer than the first wavelength.

The nanowire phosphors can reduce the number of traps as compared with conventional powdered phosphors, resulting in reduction of light loss due to non-radiative recombination.

Here, the term "nanowire" means a structure having a length relatively larger than the diameter thereof and having a nano-scale diameter of less than 1 µm.

The nanowire phosphor may be a nanowire made of ZnO, ZnO doped with Ag, ZnO doped with Al, Ga, In and/or Li, ZnO:Cu,Ga, ZnS:Cu,Ga, $ZnS_{1-x}Te_{x(0<x<1)}$, CdS:Mn capped with ZnS, ZnSe, $Zn_2SiO_4$:Mn, $(Ba, Sr, Ca)_2SiO_4$:Eu, or a nitride expressed by a general formula $Al_xIn_yGa_{(1-x-y)}N$ ($0.1 \leq x<1$, $0<y<1$, $0<x+y \leq 1$).

With proper selection of a composition ratio of the nanowire phosphor, the light having the 2 first wavelength can be converted into the light having the second wavelength in a range of visible light.

Meanwhile, the $Al_xIn_yGa_{(1-x-y)}N$ nanowire phosphor may have a composition ratio varying in a longitudinal direction such that the light having the second wavelength has at least two main peaks. Accordingly, in addition to the light having the first wavelength, polychromatic light having two or more colors can be implemented using one kind of nanowire phosphor.

Meanwhile, the nanowire phosphors may be formed on a substrate using metal organic chemical vapor deposition (MOCVD), metal organic hydride vapor phase epitaxy (MOHVPE) or molecular beam epitaxy (MBE). There is no specific limitation on the substrate and the substrate may be, for example, a silicon (Si) substrate. Thereafter, the nanowire phosphors are separated from the substrate. Thus, the nanowire phosphors can be easily fabricated, resulting in reduction of manufacturing costs.

A resin such as epoxy or silicone may cover the light emitting diode. The nanowire phosphors may be dispersed within the resin.

Meanwhile, the nanowire phosphor comprises a core nanowire and a nanoshell covering the core nanowire. The nanoshell prevents non-radiative recombination from being produced on the surface of the core nanowire. To this end, the nanoshell is preferably made of a material with a bandgap larger than that of the core nanowire.

Since nanowire phosphors are employed in accordance with the present invention, a manufacturing process is simplified to reduce manufacturing costs, and light loss due to non-radiative recombination is reduced to improve the efficiency of a light emitting device.

BRIEF DESCRIPTION OF THE DRAWINGS

FIG. 1 is a schematic sectional view illustrating a light emitting device according to an embodiment of the present invention.

FIG. 2 is a perspective view of a nanowire phosphor according to an embodiment of the present invention.

FIG. 3 is a sectional view of a nanowire phosphor according to another embodiment of the present invention.

FIG. 4 is a perspective view illustrating a method of fabricating the nanowire phosphors according to the embodiments of the present invention.

FIG. 5 is a graph showing cathodoluminescence depending on the indium content of an InGaN nanowire phosphor according to an embodiment of the present invention.

DETAILED DESCRIPTION OF THE ILLUSTRATED EMBODIMENTS

Hereinafter, preferred embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements are exaggerated for convenience of illustration. Like reference numerals indicate like elements throughout the specification and drawings.

FIG. 1 is a schematic sectional view illustrating a light emitting device 10 according to an embodiment of the present invention.

Referring to FIG. 1, the light emitting device 10 comprises a light emitting diode 13 and nanowire phosphors 20. The light emitting diode 13 is an $Al_xIn_yGa_{(1-x-y)}N$ ($0 \leq x$, y, $x+y \leq 1$) based light emitting diode capable of emitting ultraviolet, blue or green light. Particularly, the light emitting diode 13 may be a light emitting diode capable of emitting blue light in a range of 420 to 480 nm.

In general, the light emitting diode 13 is provided with two electrodes (not shown) for connection to an external power supply. The electrodes may be positioned at the same side or opposite sides of the light emitting diode 13. The electrodes may be electrically connected to lead terminals (not shown) by means of an adhesive or bonding wires (not shown).

The light emitting diode 13 may be positioned within a reflection cup 17. The reflection cup 17 reflects light emitted from the light emitting diode 13 to fall in a desired range of viewing angles, thereby increasing luminance within a certain range of viewing angles. Thus, the reflection cup 17 has a certain inclined surface depending on a required viewing angle. Meanwhile, the nanowire phosphors 20 are positioned over the light emitting diode 13 to convert a portion of light emitted from the light emitting diode 13 into light with a relatively longer wavelength. At this time, the phosphors 20 may be dispersed within a transparent material 15. The transparent material 15 covers the light emitting diode 13 to protect the light emitting diode 13 from external environment such as moisture or external force. The transparent material 15 may be epoxy or silicone, and may be positioned within the reflection cup 17 as shown in the figure.

If the light emitting diode 13 emits blue light, the nanowire phosphors 20 may be excited by the blue light and emit yellow light. On the contrary, nanowire phosphors 20 that are excited by blue light and respectively emit green and red light may be positioned together over the light emitting diode 13. Meanwhile, the nanowire phosphors 20 may be excited by blue light and emit both green and red light. Accordingly, blue light emitted from the light emitting diode 13, and yellow light or green and red light from the phosphors 20 are mixed so that white light can be emitted to the outside.

On the other hand, if the light emitting diode 13 emits ultraviolet light, the nanowire phosphors 20 may be excited by the ultraviolet light and emit blue and yellow light, or blue, green and yellow light, etc.

Consequently, the nanowire phosphors 20 capable of performing wavelength conversion of a portion of light emitted from the light emitting diode 13 are employed to implement polychromatic light with various color combinations.

FIG. 2 is a perspective view illustrating a nanowire phosphor 20 according to an embodiment of the present invention.

Referring to FIG. 2, the nanowire phosphor 20 is a structure having a length relatively larger than the diameter thereof and having a nano-scale diameter of less than 1 μm. The nanowire phosphor 20 may be a nanowire made of ZnO, ZnO doped with Ag, ZnO doped with Al, Ga, In and/or Li, ZnO:Cu,Ga, ZnS:Cu,Ga, $ZnS_{(1-x)}Te_x$ $_{(0<x<1)}$, CdS:Mn capped with ZnS, ZnSe, $Zn_2SiO_4$:Mn, (Ba, Sr, Ca)$_2SiO_4$:Eu; or a nitride expressed by a general formula $Al_xIn_yGa_{(1-x-y)}N$ ($0 \leq x<1$, $0<y<1$, $0<x+y \leq 1$).

ZnO generally emits light falling in a broad band throughout green and yellow regions, and ZnO doped with Ag emits light falling in bands divided into green and yellow regions. Further, ZnO doped with Al, Ga, In and/or Li intensifies emission of green and yellow light. Meanwhile, ZnO:Cu,Ga emits deep green light, and ZnS:Cu,Ga emits blue light. Meanwhile, CdS:Mn capped with ZnS emits yellow light.

It has been known that $ZnS_{(1-x)}Te_x$ is grown on a GaAs or Si substrate using a molecular beam epitaxy (MBE) method. $ZnS_{(1-x)}Te_x$ can emit light with a desired wavelength throughout the entire region of visible light by adjusting x.

$Zn_2SiO_4$:Mn has α and β phases, and the α and β phases emit green light and light in the vicinity of yellow light, respectively. Further, (Ba, Sr, Ca)$_2SiO_4$:Eu can emit light having various colors in the region of visible light by adjusting a composition ratio of Ba, Sr and Ca.

Meanwhile, the nanowire made of a nitride expressed by a general formula $Al_xIn_yGa_{(1-x-y)}N$ ($0 \leq x<1$, $0<y \leq 1$, $0<x+y \leq 1$) can emit light having various colors in the range of visible light depending on a composition ratio of Al and In.

Although the nanowire phosphor 20 has the shape of a rod, it is not limited thereto but may have the shape of a longitudinally curved wire.

FIG. 3 is a sectional view illustrating a nanowire phosphor 30 according to another embodiment of the present invention.

Referring to FIG. 3, the nanowire phosphor 30 comprises a core nanowire 25 and a nanoshell 23 for enclosing the core nanowire. The core nanowire 25 may be made of the same material as the nanowire phosphor 20 described above.

Meanwhile, it is preferred that the nanoshell 23 be made of a material with a bandgap larger than that of the core nanowire 25. Accordingly, non-radiative recombination produced on the surface of the core nanowire 25 is prevented, resulting in more reduced light loss.

For example, in a case where the core nanowire 25 is made of $Al_xIn_yGa_{(1-x-y)}N$ ($0 \leq x<1$, $0<y<1$, $0<x+y \leq 1$), the nanoshell 25 may be made of a nitride expressed by a general formula $Al_xIn_yGa_{(1-x-y)}N$ ($0 \leq x \leq 1$, $0 \leq y<1$, $0 \leq x+y \leq 1$).

FIG. 4 is a perspective view for illustrating a method of fabricating the nanowire phosphors 20 according to the embodiments of the present invention.

Referring to FIG. 4, the nanowire phosphors 20 are formed on a substrate 11. It is not necessary that the substrate 11 should be lattice-matched with the nanowire phosphors 20. For example, in a case where the nanowire phosphors 20 are made of $Al_xIn_yGa_{(1-x-y)}N$, it is not necessary that the substrate 11 should be a sapphire or SiC substrate. Since there is no specific limitation on the substrate 11, the substrate may be an inexpensive silicon (Si) or glass substrate.

The nanowire phosphors 20 may be formed using an MOCVD, MOHVPE or MBE method. InGaN nanowires formed on a silicon substrate using an HVPE method are disclosed in the inventor's paper entitled "InGaN nanorods grown on (111) silicon substrate by hydride vapor phase epitaxy" (Chemical Physics Letters 380 (2003) 181-184), published on Sep. 26, 2003.

According to the paper, Ga and In metals are reacted with HCl to synthesize a precursor of Ga and In, and the precursor is transported together with $NH_3$ to a (111) silicon substrate region so as to form $In_xGa_{1-x}N$ nanowire on the silicon substrate. At this time, a nanowire having a mean diameter of about 50 nm and a mean length of about 10 μm is obtained on the substrate at a temperature of 510° C. Meanwhile, the cathodoluminescence (CL) spectrum of $In_{0.1}Ga_{0.9}N$ has a main peak at 428 nm. Since a bandgap becomes smaller as the indium content of InGaN increases, the CL spectrum can be shifted toward a longer wavelength if the indium content is increased.

Trimethylgallium (TMG) and trimethylindium (TMI) may be used as the precursor of Ga and In. Further, a precursor of Al, e.g., trimethylaluminum (TMA) may be transported to a silicon substrate region so as to form $Al_xIn_yGa_{(1-x-y)}N$. Meanwhile, flow rates of precursors of Ga, In and Al may be controlled to form $Al_xIn_yGa_{(1-x-y)}N$ with various composition ratios, and it is also possible to form a nitride nanowire with different composition ratios along its length.

After the nanowire phosphors 20 formed on the substrate 11 have been separated therefrom, they are used in manufacturing the light emitting device (10 in FIG. 1).

Meanwhile, after the nanowire phosphors 20 have been formed on the substrate 11, the nanoshells (23 in FIG. 3) for covering the nanowire phosphors 20 may be formed. Accordingly, the nanowire phosphors 30 of FIG. 3 are formed on the substrate 11, and the nanowire phosphors 20 become the core nanowires (25 in FIG. 3).

The nanoshell may also be formed using an MOCVD, MOHVPE or MBE method and may 1 be grown in situ within the same reactor for use in forming the core nanowire 25. Specifically, after the core nanowires 25 have been formed, residual gas within the reactor is exhausted, and precursors of Ga and N are supplied again into the reactor at flow rates of 10 to 200 sccm and 100 to 2,000 sccm, respectively. The temperature of the reactor may be 400 to 800° C. At this time, the precursors of Al and/or In may be supplied together. Accordingly, the nanoshells 23 made of $Al_xIn_yGa_{(1-x-y)}N$ ($0 \leq x \leq 1$, $0 \leq y < 1$, $0 \leq x+y \leq 1$) for covering the core nanowires 25 are formed. The nanoshells are made of a material with a bandgap larger than that of the core nanowires. For example, if the core nanowires are made of InGaN, the nanoshells may be made of GaN.

FIG. 5 is a graph illustrating the CL spectra of nanowire phosphor samples 33, 35, 37 and 39 each of which comprises an $In_xGa_{1-x}N$ core nanowire and a GaN nanoshell. Here, these samples are prepared by changing the indium content y of InGaN. That is, the indium contents y of the samples 33, 35, 37 and 39 are 0.22, 0.33, 0.40 and 0.55, respectively.

Referring to FIG. 5, since the bandgap of InGaN becomes smaller as the indium content of the core nanowire increases, the wavelength of the CL spectrum is shifted toward a longer wavelength. Meanwhile, the samples 33, 35, 37 and 39 have main peaks in wavelength ranges of blue, green, yellow and red, respectively.

Consequently, it is possible to provide nanowire phosphors capable of emitting light throughout the entire region of visible light by controlling the indium content of core nanowires.

What is claimed is:

1. A light emitting device, comprising:
    a light emitting diode to emit light having a first wavelength with a main peak in at least one wavelength range selected from ultraviolet, blue, and green wavelength ranges; and
    a plurality of nanowire phosphors to convert at least a portion of light having the first wavelength emitted from the light emitting diode into light having a second wavelength longer than the first wavelength, the second wavelength having at least two main peaks in the range of visible light,
    wherein each nanowire phosphor of the plurality of nanowire phosphors has a length greater than the diameter, wherein the diameter is less than 1 μm, and
    wherein each nanowire phosphor of the plurality of nanowire phosphors is configured to convert the first wavelength of light into the second wavelength having at least two main peaks in the range of visible light.

2. The light emitting device of claim 1,
    wherein the nanowire phosphors comprises $Al_xIn_yGa_{(1-x-y)}N$ ($0x \leq 1$, $0 < y < 1$, $0 < x+y \leq 1$).

3. The light emitting device of claim 2,
    wherein y=0.22 and the second wavelength is in the blue wavelength range.

4. The light emitting device of claim 1,
    wherein the nanowire phosphors comprises a rod shape or a longitudinally curved wire shape.

5. The light emitting device of claim 1,
    wherein the nanowire phosphors convert blue light into green light and yellow light.

6. The light emitting device of claim 1,
    wherein the nanowire phosphors comprises nanowires made of ZnO doped with Ag, ZnO doped with at least one element selected from Al, Ga, In, and Li, or $(Ba, Sr, Ca)_2SiO_4$:Eu.

7. The light emitting device of claim 2,
    wherein y=0.33 and the second wavelength is in the green wavelength range.

8. The light emitting device of claim 2,
    wherein y=0.40 and the second wavelength is in the yellow wavelength range.

9. The light emitting device of claim 2,
    wherein y=0.55 and the second wavelength is in the red wavelength range.

* * * * *